United States Patent
Malhan et al.

(10) Patent No.: US 9,535,099 B2
(45) Date of Patent: Jan. 3, 2017

(54) SYSTEMS AND METHODS THAT ALLOW FOR SIMULTANEOUS SENSOR AND SIGNAL CONDITIONING CIRCUIT PERFORMANCE TESTING

(71) Applicant: HONEYWELL INTERNATIONAL INC., Morristown, NJ (US)

(72) Inventors: Vishal Malhan, Karnataka (IN); Mahendra Kumar Pradhan, Karnataka (IN)

(73) Assignee: Honeywell International Inc., Morris Plains, NJ (US)

( * ) Notice: Subject to any disclaimer, the term of this patent is extended or adjusted under 35 U.S.C. 154(b) by 142 days.

(21) Appl. No.: 14/281,216

(22) Filed: May 19, 2014

(65) Prior Publication Data

US 2015/0331016 A1    Nov. 19, 2015

(51) Int. Cl.
*G01R 27/02* (2006.01)
*G01R 17/10* (2006.01)
*G01R 3/00* (2006.01)
*G01D 18/00* (2006.01)

(52) U.S. Cl.
CPC .............. *G01R 17/105* (2013.01); *G01D 18/00* (2013.01); *G01R 3/00* (2013.01); *G01R 27/02* (2013.01); *Y10T 29/4913* (2015.01)

(58) Field of Classification Search
USPC ............... 324/706, 610, 648, 651, 657, 666, 673,324/680, 725, 202, 322, 525, 526, 527, 537,324/600, 601, 685, 713, 750.01, 750.3; 600/438, 488; 702/104, 117, 118, 127, 189; 73/649, 700, 753, 862.628; 361/56; 374/E15.001, E7.024
See application file for complete search history.

(56) References Cited

U.S. PATENT DOCUMENTS

| | | | | |
|---|---|---|---|---|
| 4,611,163 A * | 9/1986 | Madeley | ............... | G01L 1/2281 |
| | | | | 323/367 |
| 5,831,146 A * | 11/1998 | Newman | ................ | G01N 27/16 |
| | | | | 324/610 |
| 6,819,118 B2 * | 11/2004 | Kusuyama | ............... | G01D 5/16 |
| | | | | 324/609 |
| 2007/0046300 A1 * | 3/2007 | Kay | ........................ | G01K 7/20 |
| | | | | 324/725 |

(Continued)

OTHER PUBLICATIONS

Phoenix Contact; Universal Strain Gage/Load cell amplifier MCR-Strain Gage; Data sheet 1520C; Oct. 2003.*

*Primary Examiner* — Melissa Koval
*Assistant Examiner* — Nasima Monsur
(74) *Attorney, Agent, or Firm* — Conley Rose, P.C.; Kristin Jordan Harkins

(57) ABSTRACT

A sensor system with performance compensation testing capability includes a sensor device, a resistance bridge, a signal conditioning circuit, a first test connector, and a second test connector. The resistance bridge circuit is disposed on the sensor device and includes an excitation terminal, a circuit common terminal, and two output terminals, and is configured, upon being energized, to supply a bridge output voltage across the two output terminals. The signal conditioning circuit is electrically coupled to the excitation terminal, the circuit common terminal, and the two output terminals, and is configured to supply a sensor output signal representative of bridge output voltage. The first test connector is electrically coupled to one of the two output terminals and is configured to be coupled to an impedance test device. The second test connector is electrically coupled to the circuit common terminal and is configured to be coupled to the impedance test device.

10 Claims, 1 Drawing Sheet

(56) References Cited

U.S. PATENT DOCUMENTS

| | | | |
|---|---|---|---|
| 2008/0067960 A1* | 3/2008 | Maeda | H02P 21/06 318/400.02 |
| 2008/0109199 A1* | 5/2008 | Conero | A61B 5/021 703/11 |
| 2010/0244813 A1* | 9/2010 | Hynd | G01P 15/0802 324/101 |

* cited by examiner

SYSTEMS AND METHODS THAT ALLOW FOR SIMULTANEOUS SENSOR AND SIGNAL CONDITIONING CIRCUIT PERFORMANCE TESTING

TECHNICAL FIELD

The present invention generally relates to sensor systems, and more particularly relates to sensor systems and methods that allow simultaneous sensor and signal conditioning circuit performance testing.

BACKGROUND

Sensors are used in myriad systems and environments to sense various physical phenomena. Many sensors are implemented using one or more variable resistances connected together to form a resistance bridge circuit. The resistance bridge circuit is typically coupled to a signal conditioning circuit. The signal conditioning circuit typically provides excitation voltage to the resistance bridge circuit, and additionally implements various functions to appropriately condition the resistance bridge circuit output signal.

One of the functions that the signal conditioning circuit implements includes performance compensation that results from non-linearity or temperature-based shifts in the output of the resistance bridge circuit. Moreover, the signal conditioning circuit itself may need to be compensated for its own performance shifts. To properly implement the performance compensation for operation, the sensor system (i.e., sensor and signal conditioning circuit) undergo performance compensation testing.

It is preferable to simultaneously conduct performance compensation testing on the sensor and signal conditioning circuit. However, for some sensor system applications this is not practical. For example, when the sensor system needs to undergo relatively high pressure and/or high temperature, and/or wide ranges of pressure and/or temperature, providing a suitable test setup can be relatively complicated, costly, and time-consuming. Thus, in many instances, the signal conditioning circuit undergoes separate performance testing, which increases overall cycle time, process costs, and testing costs.

Hence, there is a need for a system and method that readily facilitates simultaneous performance compensation testing of both the sensor and signal conditioning circuit of a sensor system. The present invention addresses at least this need.

BRIEF SUMMARY

This summary is provided to describe select concepts in a simplified form that are further described in the Detailed Description. This summary is not intended to identify key or essential features of the claimed subject matter, nor is it intended to be used as an aid in determining the scope of the claimed subject matter.

In one embodiment, a sensor system with performance compensation testing capability includes a sensor device, a resistance bridge, a signal conditioning circuit, a first test connector, and a second test connector. The resistance bridge circuit is disposed on the sensor device and includes an excitation terminal, a circuit common terminal, and two output terminals. The resistance bridge circuit is configured, upon being energized, to supply a bridge output voltage across the two output terminals. The signal conditioning circuit is electrically coupled to the excitation terminal, the circuit common terminal, and the two output terminals. The signal conditioning circuit is configured to supply a sensor output signal representative of the bridge output voltage. The first test connector is electrically coupled to one of the two output terminals and is configured to be coupled to an impedance test device. The second test connector is electrically coupled to the circuit common terminal and is configured to be coupled to the impedance test device.

In another embodiment, a method for testing a sensor circuit that is configured to supply a sensor output signal includes connecting an impedance test device to the sensor circuit. The impedance test device configured to electrically couple a resistance to the sensor circuit. The sensor circuit is placed at a first temperature, and the impedance of the impedance test device is varied at a plurality of different temperatures. The sensor output signal is observed while varying the impedance of the impedance test device at the plurality of different temperatures. The sensor circuit a sensor device, a resistance bridge, a signal conditioning circuit, a first test connector, and a second test connector. The resistance bridge circuit is disposed on the sensor device and includes an excitation terminal, a circuit common terminal, and two output terminals. The resistance bridge circuit is configured, upon being energized, to supply a bridge output voltage across the two output terminals. The signal conditioning circuit is electrically coupled to the excitation terminal, the circuit common terminal, and the two output terminals. The signal conditioning circuit is configured to supply a sensor output signal representative of the bridge output voltage. The first test connector is electrically coupled to one of the two output terminals and is configured to be coupled to an impedance test device. The second test connector is electrically coupled to the circuit common terminal and is configured to be coupled to the impedance test device.

In yet another embodiment, a method of making a sensor device includes disposing a resistance bridge circuit on a sensor device. The resistance bridge circuit includes an excitation terminal, a circuit common terminal, and two output terminals, and the resistance bridge circuit is configured, upon being energized, to supply a bridge output voltage across the two output terminals. The resistance bridge circuit and sensor device are disposed in a sensor housing assembly. A signal conditioning circuit is electrically connected to the excitation terminal, the circuit common terminal, and the two output terminals. The signal conditioning circuit is configured to supply a sensor output signal representative of the bridge output voltage. The signal conditioning circuit is disposed in the sensor housing assembly. A first test connector is electrically coupled to one of the two output terminals and is configured to be coupled to an impedance test device. The first test connector is disposed on or in the sensor housing assembly. A second test connector is electrically coupled to the circuit common terminal and is configured to be coupled to the impedance test device. The second test connector is disposed on or in the sensor housing assembly.

Furthermore, other desirable features and characteristics of the sensor system and method will become apparent from the subsequent detailed description and the appended claims, taken in conjunction with the accompanying drawings and the preceding background.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary, or the following detailed description.

Figure 1:
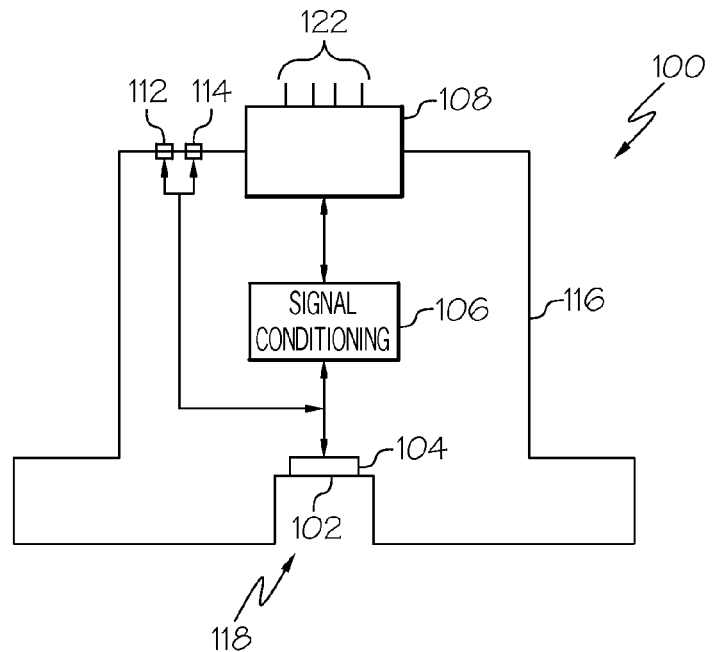
FIG. 1 depicts a simplified representation of one embodiment of a sensor system.
Figure 2:
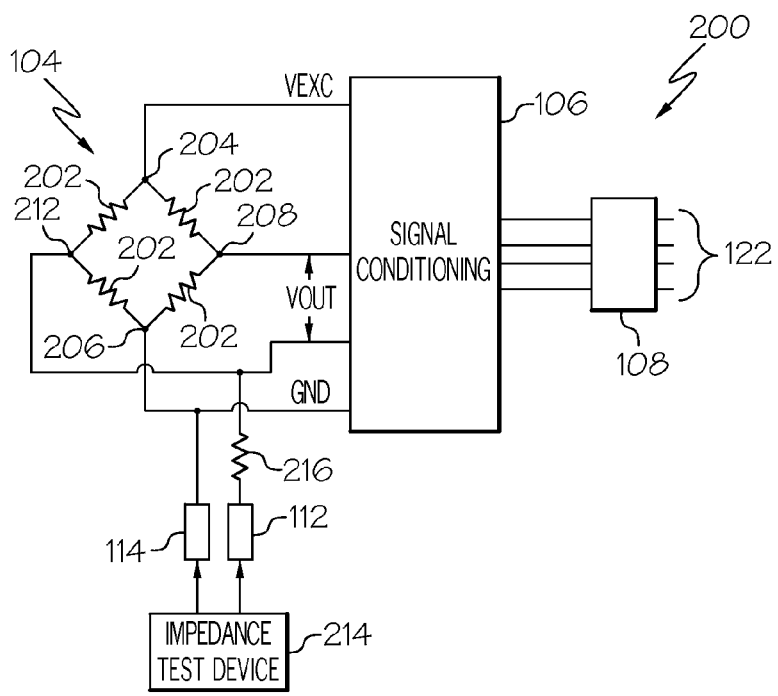
FIG. 2 depicts a simplified functional block diagram of an embodiment of a portion of the electronics that comprise the sensor system of FIG. 1.

Referring now to FIGS. 1 and 2, a simplified representation of one embodiment of a sensor system 100 is depicted in FIG. 1, and a simplified functional block diagram of an embodiment of a portion of the electronics 200 that comprise the sensor system 100 is depicted in FIG. 2. Before describing the sensor system 100 in more detail, it should be noted that although the depicted and described sensor system 100 is configured as a pressure sensor system, the concepts described herein are not limited to use with pressure sensors, but may also be used with other types of sensors.

The sensor system 100 includes a sensor device 102, a resistance bridge circuit 104, a signal conditioning circuit 106, an output connector 108, a first test connector 112, and a second test connector 114, all mounted in or on a sensor housing assembly 116. It will be appreciated that the sensor system 100 may include additional components, not just those depicted and described herein.

The sensor device 102, at least in the depicted embodiment, is configured as a pressure sensor, and more particularly as a diaphragm-type pressure sensor. As is generally known, with this type of sensor, one side of the sensor device 102 is configured to be exposed to a monitored pressure. To facilitate this, the sensor housing assembly 116 has an opening 118 formed therein to expose the sensor device to the monitored pressure.

The other side of the sensor device 102 has measurement circuitry disposed thereon. In this embodiment, the measurement circuitry comprises the resistance bridge circuit 104. The resistance bridge circuit 104, which is shown more clearly in FIG. 2, comprises a plurality of variable resistances 202 connected together in a conventional Wheatstone bridge configuration, and includes an excitation terminal 204, a circuit common terminal 206, and two output terminals—a first output terminal 208 and a second output terminal 212. As is also generally known, the resistance bridge circuit 104 is configured, upon being energized, to supply a bridge output voltage ($V_{OUT}$) across the two output terminals 208, 212. It will be appreciated that the variable resistances 202 may be implemented, for example, using strain gauges, or the like.

The signal conditioning circuit 106 is electrically coupled to the resistance bridge circuit 104, and more particularly is electrically coupled to the excitation terminal 204, the circuit common terminal 206, and the two output terminals 208, 212. The signal conditioning circuit 106 is configured, upon being electrically energized, to supply an electrical excitation voltage ($V_{EXC}$) to the resistance bridge circuit 104. The signal conditioning circuit 106 is additionally configured, in response to the bridge output voltage ($V_{OUT}$), to supply a sensor output signal representative thereof to the output connector 108.

The output connector 108 includes a plurality connector pins 122. Although the depicted output connector 108 includes 4 connector pins 122, it will be appreciated that in some embodiments it may include more or less than this number of connector pins. Regardless of the specific number, the output connector 108 is configured to connect to non-illustrated external equipment to supply, via the connector pins 122, the sensor output signal thereto for further processing.

The first and second test connectors 112, 114 are each electrically coupled to different terminals of the resistance bridge circuit 104. In particular, the first test connector 112 is electrically coupled to one of the two output terminals 208, 212, and the second test connector 114 is electrically coupled to the circuit common terminal 206. In the depicted embodiment, the first test connector 114 is electrically coupled to the second output terminal 212. It will be appreciated, however, that in other embodiments the first test connector 114 could instead be electrically coupled to the first output terminal 208. In the depicted embodiment, the first and second test connectors 112, 114 are formed separate from the output connector 108. It will be appreciated that in some embodiments, the first and second test connectors 112, 114 could be formed as part of the output connector 108.

The first and second test connectors 112, 114 are each configured to be coupled to an impedance test device 214. The impedance test device 214 may be any one of numerous impedance test devices now known or developed in the future. Some examples of suitable impedance test devices include a decade box, a programmable resistance, box, and a programmable capacitance box, just to name a few non-limiting examples. As FIG. 2 also depicts, a noise-reduction resistor 216 is preferably (though not necessarily) connected between the first test connector and the output terminal 208 or 212. The noise-reduction resistor 216 is preferably a relatively stable, relatively high fixed resistance (≥about 100 kΩ) to at least inhibit noise from entering the test device 214.

The impedance test device 214, when connected to the first and second test connectors 112, 114, may be used to vary the input to the signal conditioning circuit 106. This allows the performance of the signal conditioning circuit 106 to be characterized at various levels of input and at different environmental conditions, such as different temperatures, while simultaneously characterizing the resistance bridge circuit 104. The results of this characterization can be used to calculate any corrections needed to compensate the signal conditioning circuit 106 for performance shifts. An example process for simultaneously characterizing the performance of the resistance bridge circuit 104 and the signal conditioning circuit 106 will now be described.

A sensor system 100 is disposed in a variable temperature test chamber, while the applied pressure is kept relatively constant. The test chamber is kept at a first temperature, such as ambient room temperature. An impedance test device 214, such as a programmable resistor box (PRB), is connected to the first and second test connectors 112, 114, but is disposed outside the chamber at a stable, ambient room temperature.

After sufficient soak time at room temperature, the sensor system 100 is energized and the output of the sensor system 100 is recorded. The variable impedance device 214 is then varied to simulate full scale output or another predetermined output level of the sensor device 102. The temperature and the setting of the impedance test device 214 are both recorded. The sensor system 100 is then de-energized and the test chamber is set to a second, relatively colder temperature. A suitable second temperature is about ≤32 F.

After a sufficient soak time at the second temperature, the sensor system 100 is again energized and the output of the sensor system 100 is recorded. The variable impedance device 214 is once again varied to simulate full scale output of the sensor device 102. The temperature and the setting of the impedance test device 214 are both recorded. The sensor system 100 is then de-energized and the test chamber is set to a third, relatively hotter temperature. A suitable third temperature is about ≥100 F.

After a sufficient soak time at the third temperature, the sensor system 100 is again energized and the output of the sensor system 100 is recorded. The variable impedance device 214 is yet again varied to simulate full scale output of the sensor device 102. The temperature and the setting of the impedance test device 214 are both recorded. The sensor system 100 is then de-energized and the test chamber is returned to ambient.

The data recorded during the above process is then used to simultaneously derive the temperature shift and offset of the sensor device 102 and the temperature shift of the signal conditioning circuit 106. These factors may then be compensated for.

Those of skill in the art will appreciate that the various illustrative logical blocks, modules, circuits, and algorithm steps described in connection with the embodiments disclosed herein may be implemented as electronic hardware, computer software, or combinations of both. Some of the embodiments and implementations are described above in terms of functional and/or logical block components (or modules) and various processing steps. However, it should be appreciated that such block components (or modules) may be realized by any number of hardware, software, and/or firmware components configured to perform the specified functions. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention. For example, an embodiment of a system or a component may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments described herein are merely exemplary implementations.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical.

Furthermore, depending on the context, words such as "connect" or "coupled to" used in describing a relationship between different elements do not imply that a direct physical connection must be made between these elements. For example, two elements may be connected to each other physically, electronically, logically, or in any other manner, through one or more additional elements.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A sensor system with performance compensation testing capability, comprising:
   a sensor device;
   a resistance bridge circuit disposed on the sensor device and including an excitation terminal, a circuit common terminal, and two output terminals, the resistance bridge circuit configured, upon being energized, to supply a bridge output voltage across the two output terminals;

a signal conditioning circuit electrically coupled to the excitation terminal, the circuit common terminal, and the two output terminals, the signal conditioning circuit configured to supply a sensor output signal representative of the bridge output voltage;

a first test connector electrically coupled to one of the two output terminals, the first test connector configured to be coupled to an impedance test device; and a second test connector electrically coupled to the circuit common terminal so that the second test connector is directly coupled to the signal conditioning circuit, the second test connector configured to be coupled to the impedance test device to vary an input to the signal conditioning circuit for simultaneous derivation of a first temperature shift of the resistance bridge circuit and a second temperature shift of the signal conditioning circuit.

2. The system of claim 1, further comprising: a noise-reduction resistor connected between the first test connector and one of the two output terminals.

3. The system of claim 1, wherein the noise-reduction resistor has a resistance of at least 100 kilo-ohms.

4. The system of claim 1, further comprising:

a sensor housing assembly, wherein the sensor device, the resistance bridge circuit, the signal conditioning circuit, the first test connector, and the second test connector are all mounted in or on the sensor housing assembly.

5. The system of claim 1, wherein the sensor device is configured as a pressure sensor.

6. A method for testing a sensor circuit, the method comprising the steps of:

connecting an impedance test device to the sensor circuit, the sensor circuit configured to supply a sensor output signal, the impedance test device configured to electrically couple a resistance to the sensor circuit;

placing the sensor circuit at a first temperature;

varying an impedance of the impedance test device at a plurality of different temperatures; and observing the sensor output signal while varying the impedance of the impedance test device at the plurality of different temperatures; and simultaneously deriving, based on the observing, a first temperature shift of a sensor device and a second temperature shift of a signal conditioning circuit, wherein the sensor circuit comprises;

the sensor device, a resistance bridge circuit disposed on the sensor device and including an excitation terminal, a circuit common terminal, and two output terminals, the resistance bridge circuit configured, upon being energized, to supply a bridge output voltage across the two output terminals, the signal conditioning circuit electrically coupled to the excitation terminal, the circuit common terminal, and the two output terminals, the signal conditioning circuit configured to supply a sensor output signal representative of the bridge output voltage, a first test connector electrically coupled to the circuit common terminal and to the impedance test device, and a second test connector electrically coupled to one of the two output terminals and to the impedance test device.

7. The method of claim 6, wherein the plurality of different temperatures comprises at least the first temperature, a second temperature, and a third temperature.

8. The method of claim 7, wherein the second temperature is lower than the first temperature, and the third temperature is higher than the first temperature.

9. A method of making a sensor device, comprising the steps of:

disposing a resistance bridge circuit on a sensor device, the resistance bridge circuit including an excitation terminal, a circuit common terminal, and two output terminals, the resistance bridge circuit configured, upon being energized, to supply a bridge output voltage across the two output terminals;

disposing the resistance bridge circuit and sensor device in a sensor housing assembly;

electrically connecting a signal conditioning circuit to the excitation terminal, the circuit common terminal, and the two output terminals, the signal conditioning circuit configured to supply a sensor output signal representative of the bridge output voltage;

disposing the signal conditioning circuit in the sensor housing assembly;

electrically coupling a first test connector to one of the two output terminals, the first test connector configured to be coupled to an impedance test device;

disposing the first test connector on or in the sensor housing assembly;

electrically coupling a second test connector to the circuit common terminal so that the second test connector is directly coupled to the signal conditioning circuit, the second test connector configured to be coupled to the impedance test device to vary an input to the signal conditioning circuit for simultaneous derivation of a first temperature shift of the resistance bridge circuit and a second temperature shift of the signal conditioning circuit; and disposing the second test connector on or in the sensor housing assembly.

10. The system of claim 1, wherein directly coupled means that a line connects the second test connector to the signal conditioning circuit without any components between the second test connector and the signal conditioning circuit.

* * * * *